US011552120B2

(12) United States Patent
Liu et al.

(10) Patent No.: US 11,552,120 B2
(45) Date of Patent: Jan. 10, 2023

(54) CHIP-SCALE SENSOR PACKAGE STRUCTURE

(71) Applicant: KINGPAK TECHNOLOGY INC., Hsin-Chu County (TW)

(72) Inventors: Fu-Chou Liu, Hsin-Chu County (TW); Chien-Chen Lee, Hsin-Chu County (TW); Li-Chun Hung, Hsin-Chu County (TW); Ya-Han Chang, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 192 days.

(21) Appl. No.: 16/928,193

(22) Filed: Jul. 14, 2020

(65) Prior Publication Data

US 2021/0305304 A1 Sep. 30, 2021

(30) Foreign Application Priority Data

Mar. 27, 2020 (TW) ................................. 109110623

(51) Int. Cl.
*H01L 27/146* (2006.01)
*H01L 21/22* (2006.01)
*H01L 31/02* (2006.01)
*H01L 31/0203* (2014.01)

(52) U.S. Cl.
CPC ........ *H01L 27/14636* (2013.01); *H01L 21/22* (2013.01); *H01L 27/14618* (2013.01); *H01L 31/0203* (2013.01); *H01L 31/02005* (2013.01)

(58) Field of Classification Search
CPC ... H01L 23/3142; H01L 27/146–14893; H01L 31/0203; H01L 31/02005
See application file for complete search history.

(56) References Cited

U.S. PATENT DOCUMENTS 9,502,455 B2 * 11/2016 Akahoshi ................ H01L 24/19
10,720,370 B2 7/2020 Chen et al.
11,342,375 B2 * 5/2022 Hsu .................. H01L 27/14687
2018/0076244 A1 * 3/2018 Wu .................. H01L 27/14683
2018/0211989 A1 * 7/2018 Hogyoku ................ H01L 24/19
2019/0057992 A1 * 2/2019 Chen ................ H01L 27/14636
2020/0411580 A1 * 12/2020 Hsu .................. H01L 27/14618

FOREIGN PATENT DOCUMENTS

TW 202005015 A 1/2020

* cited by examiner

*Primary Examiner* — Daniel Whalen
*Assistant Examiner* — David Matthew Hartman
(74) *Attorney, Agent, or Firm* — Li & Cai Intellectual Property (USA) Office

(57) ABSTRACT

A chip-scale sensor package structure includes a sensor chip, a first package body surrounding and connected to an outer lateral side of the sensor chip, a ring-shaped support disposed on a top side of the first package body, a light permeable member disposed on the ring-shaped support, and a redistribution layer (RDL) disposed on a bottom surface of the sensor chip and a bottom side of the first package body. The sensor chip includes a sensing region arranged on the top surface thereof, a plurality of internal contacts, and a plurality of conductive paths respectively connected to the internal contacts and electrically coupled to the sensing region. The sensing region is spaced apart from the ring-shaped support by a distance less than 300 μm. A bottom surface of the RDL has a plurality of external contacts electrically coupled to the internal contacts.

9 Claims, 6 Drawing Sheets

100
D31 43 31 111 41 E 4 42 6 61 32 3 1 5 53 11 211 21 212 2 24 22 121 14 12 51 7 52 23 13

CHIP-SCALE SENSOR PACKAGE STRUCTURE

CROSS-REFERENCE TO RELATED PATENT APPLICATION

This application claims the benefit of priority to Taiwan Patent Application No. 109110623, filed on Mar. 27, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a chip-scale sensor package structure.

BACKGROUND OF THE DISCLOSURE

In a conventional chip-scale sensor package structure, a light permeable member (e.g., an optical glass) is fixed onto a sensor chip through only an adhesive which adheres a bottom side of the light permeable member to a top surface of the sensor chip, so that the adhesive may easily contaminate a sensing region arranged on the top surface of the sensor chip, thereby affecting the production yield rate or resulting in product failure of the conventional chip-scale sensor package structure.

SUMMARY OF THE DISCLOSURE

In response to the above-referenced technical inadequacies, the present disclosure provides a chip-scale sensor package structure to effectively improve on the issues associated with conventional chip-scale sensor package structures.

In one aspect, the present disclosure provides a chip-scale sensor package structure, which includes a sensor chip, a first package body, a ring-shaped support, a light permeable member, and a redistribution layer (RDL). The sensor chip includes a sensing region arranged on a top surface thereof, a plurality of internal contacts arranged on a bottom surface thereof, and a plurality of conductive paths extending from the top surface to the bottom surface thereof. The conductive paths are respectively connected to the internal contacts, and are electrically coupled to the sensing region. The first package body surrounds and is connected to an outer lateral side of the sensor chip. The ring-shaped support is disposed on a top side of the first package body without contacting the top surface of the sensor chip. The sensing region is spaced apart from the ring-shaped support by a distance less than 300 μm. The light permeable member has a first surface and a second surface that is opposite to the first surface. The second surface of the light permeable member is disposed on the ring-shaped support, and the light permeable member, the ring-shaped support, and the sensor chip jointly define an enclosed space. The RDL is disposed on the bottom surface of the sensor chip and a bottom side of the first package body. A bottom surface of the RDL has a plurality of external contacts electrically coupled to the internal contacts.

Therefore, the chip-scale sensor package structure of the present disclosure is provided with structural improvements (e.g., the ring-shaped support is disposed on the top side of the first package body, and the distance between the sensing region and the ring-shaped support can be maintained to be less than 300 μm), so that the ring-shaped support can be effectively spaced apart from the sensing region of the sensor chip for preventing the ring-shaped support from contaminating the sensing region.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

First Embodiment

Figure 1:
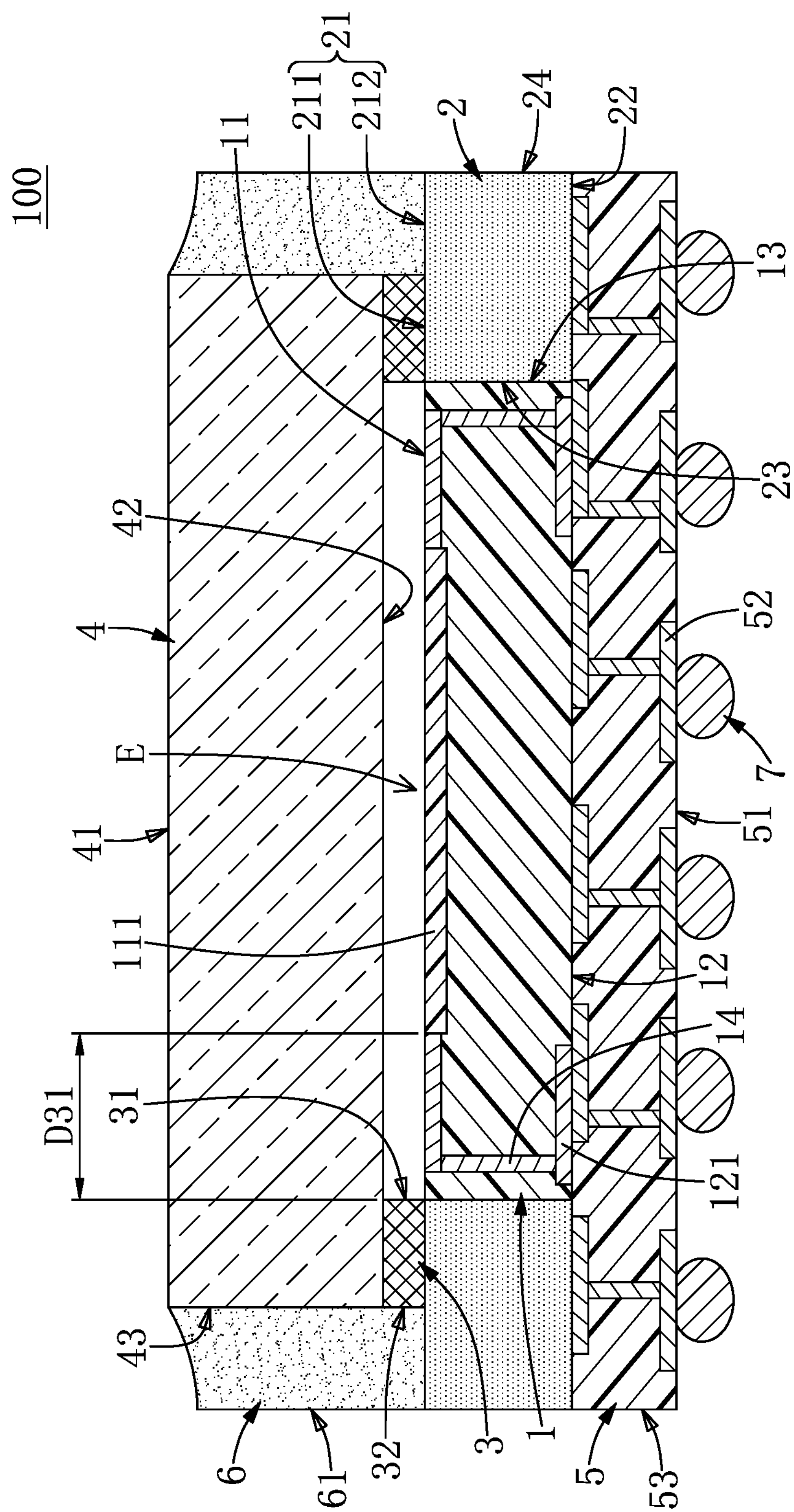
FIG. 1 is a cross-sectional view of a chip-scale sensor package structure according to a first embodiment of the present disclosure.

Referring to FIG. 1 to FIG. 6, a first embodiment of the present disclosure provides a chip-scale sensor package structure 100. As shown in FIG. 1, the chip-scale sensor package structure 100 includes a sensor chip 1, a first package body 2 surrounding and connected to an outer lateral side 13 of the sensor chip 1, a ring-shaped support 3 disposed on a top side 21 of the first package body 2, a light permeable member 4 disposed on the ring-shaped support 3, a redistribution layer (RDL) 5 disposed on a lower side of the first package body 2 and the sensor chip 1, a second package body 6 disposed on the top side 21 of the first package body 2, and a plurality of solder balls 7 that are disposed on an outer surface of the RDL 5.

It should be noted that the drawings of the present disclosure are cross-sectional views for the sake of easily describing the chip-scale sensor package structure 100 of the present embodiment, and it is understandable that portions of the chip-scale sensor package structure 100, which are not shown in the drawings, shall also have corresponding structures. For example, FIG. 1 shows only one row of the solder balls 7, but portions of the chip-scale sensor package structure 100, which are not shown in FIG. 1, shall include other solder balls 7. In the following, descriptions about structure and connection of each component of the disclosed chip-scale sensor package structure 100 will be made.

As shown in FIG. 1, the sensor chip 1 in the present embodiment is an image sensor chip, but the present disclosure is not limited thereto. An outer surface of the sensor chip 1 includes a top surface 11, a bottom surface 12 opposite to the top surface 11, and an outer lateral side 13 that is connected to a peripheral edge of the top surface 11 and a peripheral edge of the bottom surface 12. The top surface 11 of the sensor chip 1 has a sensing region 111 substantially arranged on a center portion thereof. The sensor chip 1 includes a plurality of internal contacts 121 arranged on the bottom surface 12. The sensor chip 1 further includes a plurality of conductive paths 14 extending from the top surface 11 to the bottom surface 12, and the conductive paths 14 are respectively connected to the internal contacts 121 and are electrically coupled to the sensing region 111.

The first package body 2 is in a ring-shape. The first package body 2 surrounds and is connected to the outer lateral side 13 of the sensor chip 1 without being in contact with the top surface 11 and the bottom surface 12 of the sensor chip 1. In other words, the top surface 11 and the bottom surface 12 of the sensor chip 1 are exposed from the first package body 2. In the present embodiment, the top side 21 of the first package body 2 is coplanar with the top surface 11 of the sensor chip 1, and the bottom side 22 of the first package body 2 is coplanar with the bottom surface 12 of the sensor chip 1, but the present disclosure is not limited thereto. For example, in other embodiments not shown in the present disclosure, the top side 21 and the top surface 11 may be in different planes, and the bottom side 22 and the bottom surface 12 may be in different planes.

Specifically, the top side 21 of the first package body 2 has (or defines) a ring-shaped inner region 211 and a ring-shaped outer region 212 that surrounds (or extends from) the inner region 211, and an area difference between the inner region 211 and the outer region 212 is preferably equal to or less than 15% of an area of the top side 21 of the first package body 2, but the present disclosure is not limited thereto.

The ring-shaped support 3 is disposed on the top side 21 of the first package body 2, and is not in contact with the top surface 11 of the sensor chip 1. In the present embodiment, the ring-shaped support 3 can be a glue or an adhesive, and the ring-shaped support 3 is connected to the inner region 211 of the top side 21 of the first package body 2. Specifically, an inner lateral side 31 of the ring-shaped support 3 is coplanar with an inner lateral side 23 of the first package body 2, and an outer edge of the sensing region 111 is spaced apart from the inner lateral side 31 of the ring-shaped support 3 by a distance D31 which is less than 300 μm.

The light permeable member 4 includes a first surface 41, a second surface 42 opposite to the first surface 41, and an outer lateral side 43 connected to a peripheral edge of the first surface 41 and a peripheral edge of the second surface 42. The second surface 42 of the light permeable member 4 is disposed on the ring-shaped support 3 (i.e., the ring-shaped support 3 is sandwiched between the top side 21 of the first package body 2 and the second surface 42 of the light permeable member 4), so that the light permeable member 4, the ring-shaped support 3, and the sensor chip 1 jointly define an enclosed space E.

The light permeable member 4 in the present embodiment is a transparent glass plate. Along the horizontal direction of FIG. 1, an outer diameter of the light permeable member 4 is greater than that of the sensor chip 1, but the present disclosure is not limited thereto. Moreover, along the horizontal direction of FIG. 1, the outer diameter of the light permeable member 4 is equal to that of the ring-shaped support 3. In other words, the outer lateral side 43 of the light permeable member 4 is flush with (or coplanar with) the outer lateral side 32 of the ring-shaped support 3.

However, in other embodiments not shown in the present disclosure, the outer diameter of the light permeable member 4 can be slightly less than that of the ring-shaped support 3. Or, the outer diameter of the light permeable member 4 can be slightly greater than that of the ring-shaped support 3, so that the outer region 212 of the top side 21 of the first package body 2, the outer lateral side 32 of the ring-shaped support 3, and the light permeable member 4 can jointly define a ring-shaped slot.

The RDL 5 is disposed on the bottom surface 12 of the sensor chip 1 and the bottom surface 22 of the first package body 2, and an outer lateral side 53 of the RDL 5 is coplanar with an outer lateral side 24 of the first package body 2. In the present embodiment, the RDL 5 is formed directly on the bottom surface 12 of the sensor chip 1 and the bottom surface 22 of the first package body 2, but the present disclosure is not limited thereto.

The RDL 5 includes a plurality of external contacts 52 arranged on a bottom surface 51 thereof and electrically coupled to the internal contacts 121. Specifically, through the RDL 5, the internal contacts 121 of the sensor chip 1 are connected to the external contacts 52 dispensed at larger intervals (i.e., the RDL 5 can be regarded as a circuit fan-out structure). In other words, a part of the external contacts 52 are arranged outside of a projection area defined by orthogonally projecting the internal contacts 121 onto the bottom surface 51 of the RDL 5, and the portion of the RDL 5 under the package body 4 is preferably formed with at least part of the external contacts 52, but the present disclosure is not limited thereto.

Moreover, the solder balls 7 are respectively disposed on the external contacts 52 of the bottom surface 51 of the RDL 5. Accordingly, the chip-scale sensor package structure 100 can be soldered onto an electronic component (e.g., a printed circuit board) through the solder balls 7, thereby electrically connecting the chip-scale sensor package structure 100 to the electronic component.

The second package body 6 is in a ring-shape and is disposed on the outer region 212 of the top side 21 of the first package body 2. Moreover, the second package body 6 surrounds and is connected to the outer lateral side 43 of the light permeable member 4 and the outer lateral side 32 of the ring-shaped support 3, and the first surface 41 of the light permeable member 4 is exposed from the second package body 6. Furthermore, an outer lateral side 61 of the second package body 6 is preferably coplanar with the outer lateral side 24 of the first package body 2.

The above paragraphs are the description about structure and connection of each component of the chip-scale sensor package structure 100. To make the embodiment more understandable, the following description will further describe a manufacturing method of the chip-scale sensor package structure 100. However, the chip-scale sensor package structure 100 of the present embodiment is not limited to be manufactured by the method. As shown in FIG. 2 to FIG. 6, the manufacturing method of the chip-scale sensor package structure 100 in the present embodiment includes a first packaging step S110, a layout step S120, a cover placement step S130, a second packaging step S140, a ball placement step S150, and a slicing step S160, and the following description briefly discloses the above steps S110-S160.

Figure 2:
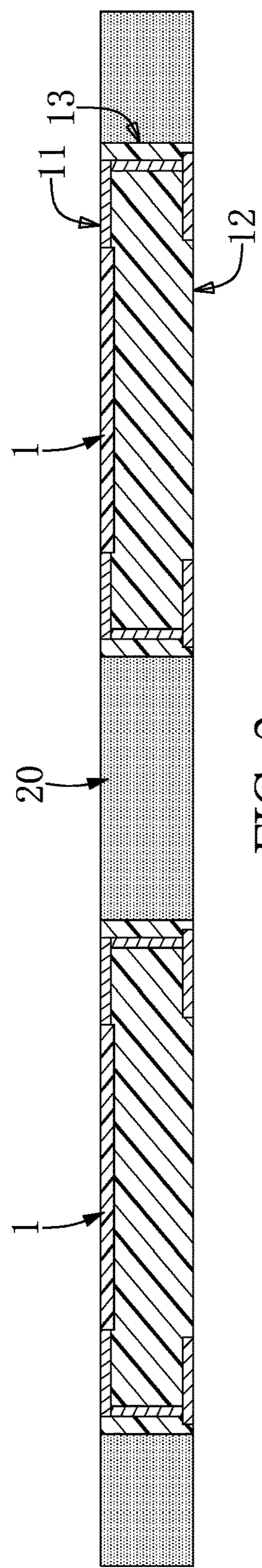
FIG. 2 is a cross-sectional view showing a first packaging step of a manufacturing method of the chip-scale sensor package structure according to the first embodiment of the present disclosure.

As shown in FIG. 2, the first packaging step S110 is implemented by forming a first package unit 20 onto the outer lateral sides 13 of the plurality of sensor chips 1, so that the sensor chips 1 can be bonded together through the first package unit 20. Specifically, a bottom side of the first package unit 20 is coplanar with the bottom surfaces of the sensor chips 1, and the first package unit 20 is not in contact with the top surfaces 11 of the sensor chips 1.

Figure 3:
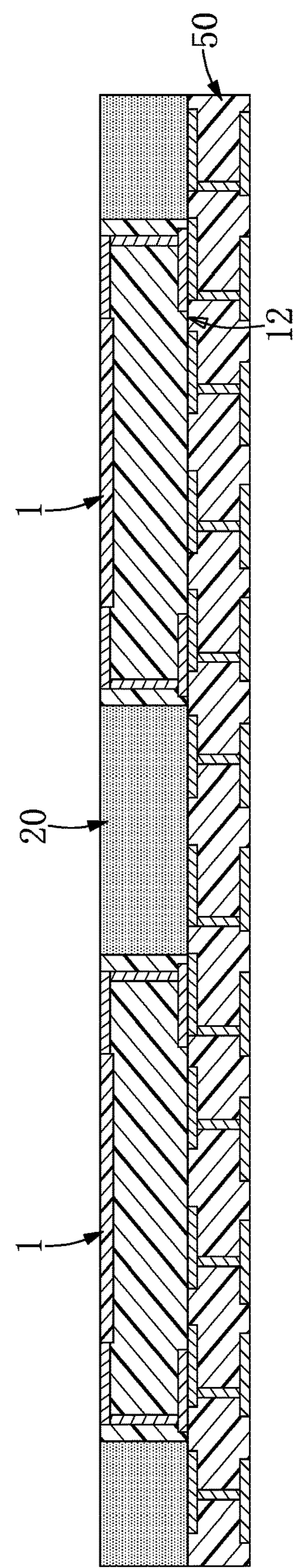
FIG. 3 is a cross-sectional view showing a layout step of the manufacturing method of the chip-scale sensor package structure according to the first embodiment of the present disclosure.

As shown in FIG. 3, the layout step S120 is implemented by forming a RDL unit 50 onto the bottom side of the first package unit 20 and the bottom surfaces 12 of the sensor chips 1. Specifically, the RDL unit 50 is electrically coupled to the sensor chips 1.

Figure 4:
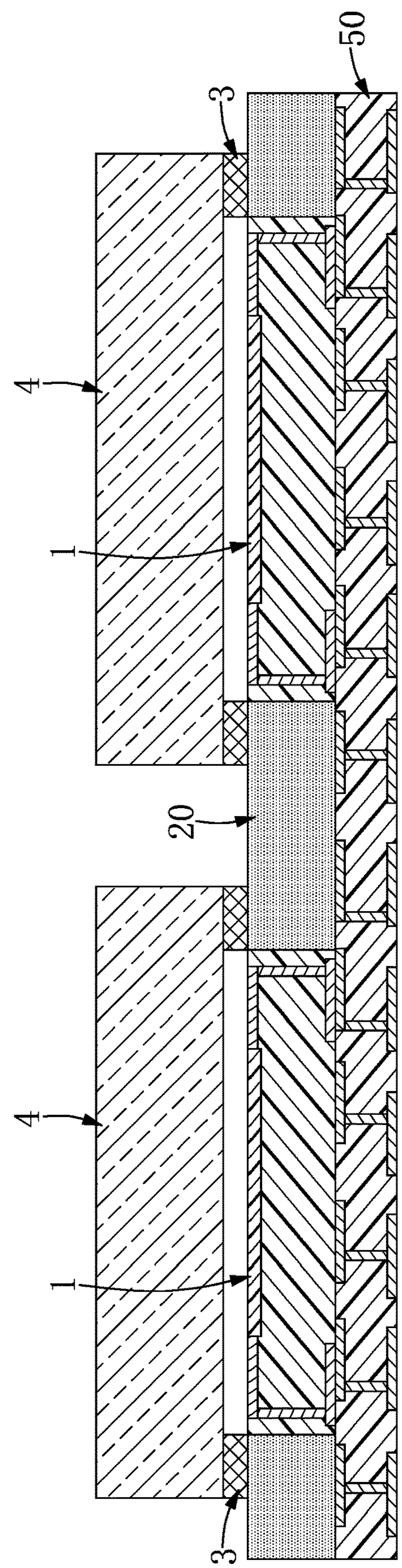
FIG. 4 is a cross-sectional view showing a cover placement step of the manufacturing method of the chip-scale sensor package structure according to the first embodiment of the present disclosure.

As shown in FIG. 4, the cover placement S130 is implemented by forming the plurality of ring-shaped supports 3 onto the top side of the first package unit 20, in which the ring-shaped supports 3 respectively correspond in position to the sensor chips 1, and then further placing the plurality of light permeable members 4 onto the ring-shaped supports 3, respectively.

Figure 5:
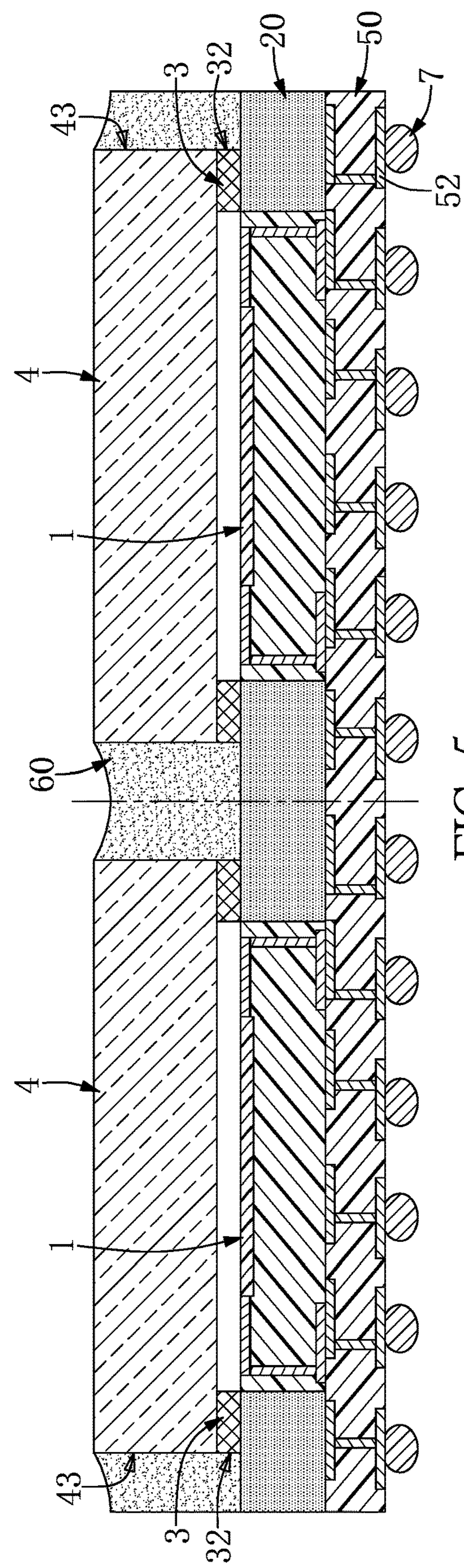
FIG. 5 is a cross-sectional view showing a second packaging step of the manufacturing method of the chip-scale sensor package structure according to the first embodiment of the present disclosure.

As shown in FIG. 5, the second packaging step S140 is implemented by forming a second package unit 60 onto a top side of the first package unit 20 to surround and connect the outer lateral sides 43 of the light permeable members 4 and the outer lateral sides 32 of the ring-shaped supports 3.

A shown in FIG. 5, the ball placement S150 is implemented by respectively fixing the plurality of solder balls 7 onto the external contacts 52 of the RDL unit 50.

Figure 6:
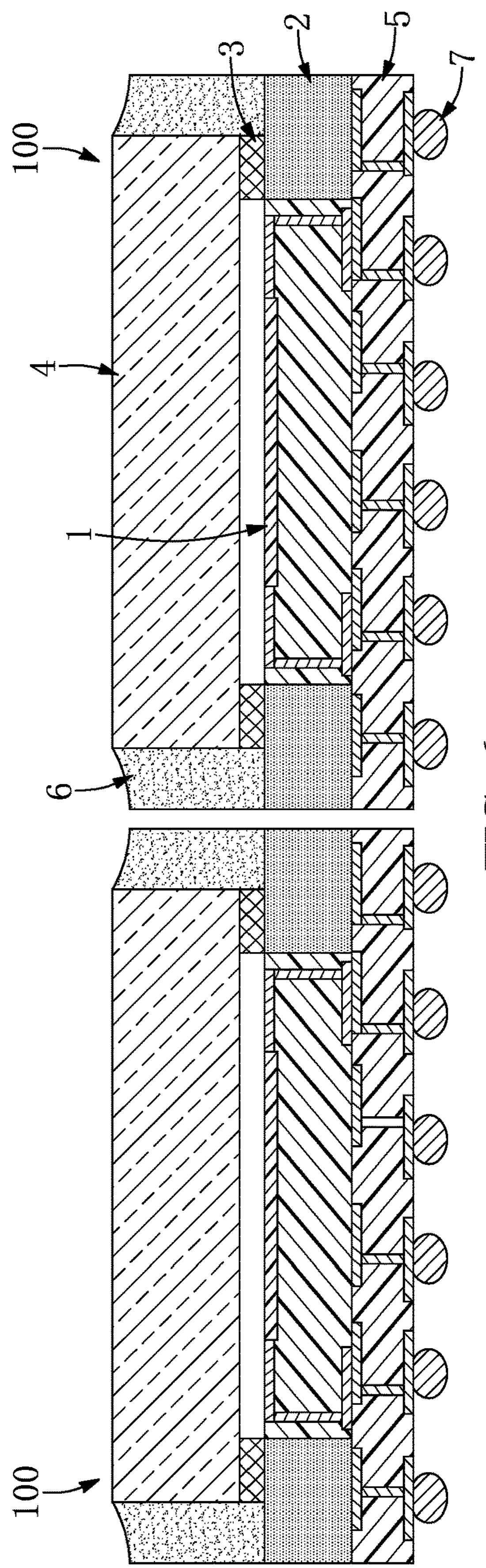
FIG. 6 is a cross-sectional view showing a ball placement step and a slicing step of the manufacturing method of the chip-scale sensor package structure according to the first embodiment of the present disclosure.

As shown in FIG. 5 and FIG. 6, the slicing step S160 is implemented by slicing the second package unit 60, the first package unit 20, and the RDL unit 50, so that the second package unit 60 is partitioned into the plurality of second package bodies 6, the first package unit 20 is partitioned into the plurality of first package bodies 2, and the RDL unit 50 is partitioned into the plurality of RDLs 5. Accordingly, the plurality of chip-scale sensor package structures 100 can be obtained.

Second Embodiment

Figure 7:
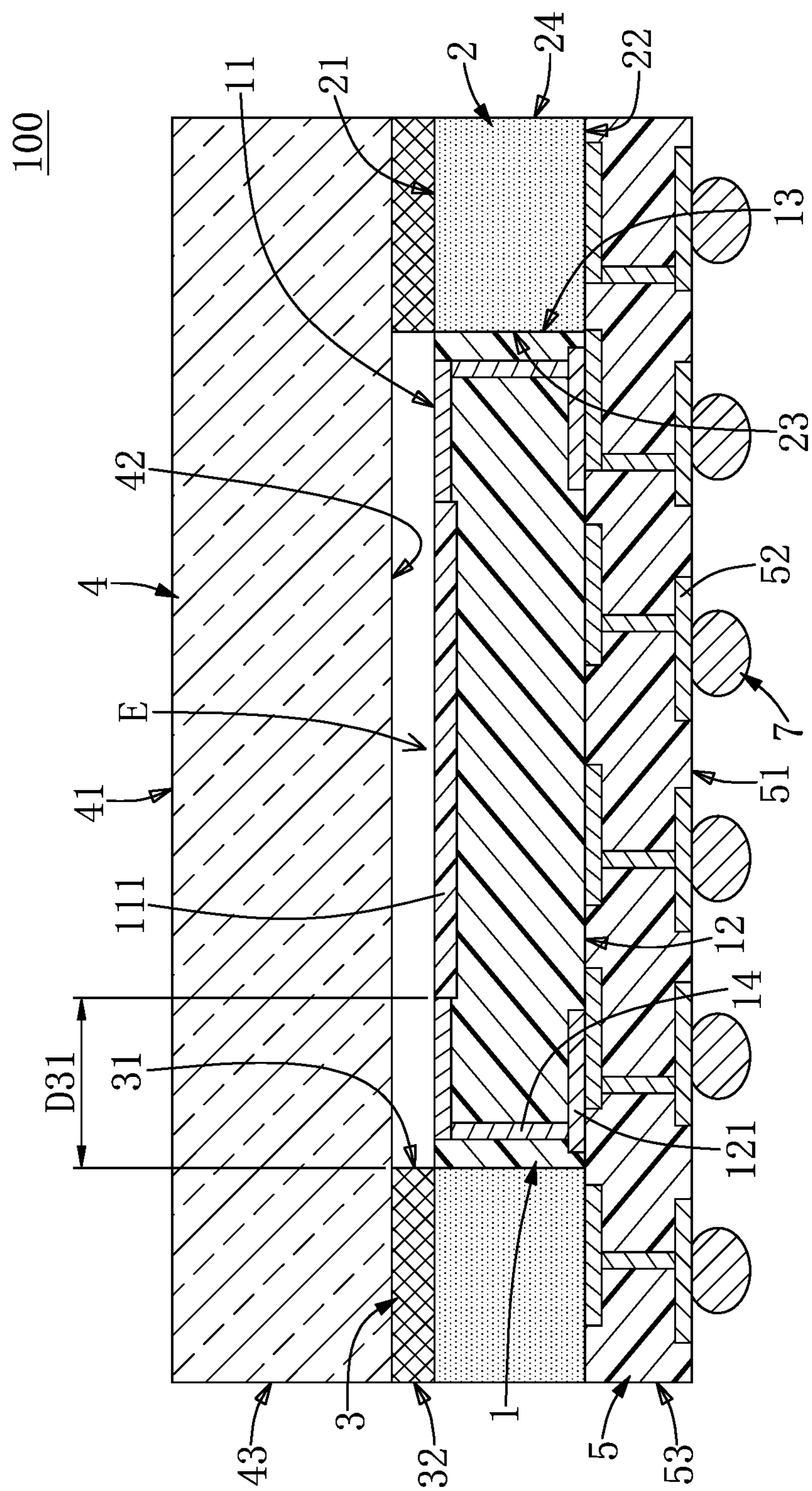
FIG. 7 is a cross-sectional view of a chip-scale sensor package structure according to a second embodiment of the present disclosure.

Referring to FIG. 7, a second embodiment of the present disclosure is similar to the first embodiment of the present disclosure. Common parts of the two embodiments shall not be recited again, and the differences between the two embodiments will be described as the followings.

In the present embodiment, the chip-scale sensor package structure 100 does not include the second package body 6. In other words, the outer lateral side 43 of the light permeable member 4, the outer lateral side 32 of the ring-shaped support 3, the outer lateral side 24 of the first package body 2, and the outer lateral side 53 of the RDL 5 are coplanar with each other.

In conclusion, the chip-scale sensor package structure of the present disclosure is provided with structural improvements (e.g., the ring-shaped support is disposed on the top side of the first package body, and the distance between the sensing region and the ring-shaped support can be maintained to be less than 300 μm), so that the ring-shaped support can be effectively spaced apart from the sensing region of the sensor chip for preventing the ring-shaped support from polluting the sensing region.

Moreover, in the chip-scale sensor package structure of the present disclosure, the RDL is formed directly on the bottom surface of the sensor chip and the bottom side of the first package body, and the outer lateral side of the light permeable member is covered by the second package body. In this way, bonding strength of the light permeable member in the chip-scale sensor package structure could be reinforced. Accordingly, when the chip-scale sensor package structure is subjected to a temperature cycle test (TCT), a delamination defect of the light permeable member can be avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip-scale sensor package structure, comprising:

a sensor chip including a sensing region arranged on a top surface thereof, a plurality of internal contacts arranged on a bottom surface thereof, and a plurality of conductive paths extending from the top surface to the bottom surface thereof, wherein the conductive paths are respectively connected to the internal contacts and electrically coupled to the sensing region;

a first package body surrounding and connected to an outer lateral side of the sensor chip;

a ring-shaped support disposed on a top side of the first package body without contacting the top surface of the sensor chip, wherein the sensing region is spaced apart from the ring-shaped support by a distance which is less than 300 μm;

a light permeable member having a first surface and a second surface that is opposite to the first surface, wherein the second surface of the light permeable member is disposed on the ring-shaped support, and the light permeable member, the ring-shaped support, and the sensor chip jointly define an enclosed space; and a redistribution layer (RDL) disposed on the bottom surface of the sensor chip and a bottom side of the first package body, wherein a bottom surface of the RDL has a plurality of external contacts electrically coupled to the internal contacts;

wherein the top side of the first package body is coplanar with the top surface of the sensor chip, and an outer lateral side of the light permeable member is coplanar with an outer lateral side of the ring-shaped support;

wherein at least one of the external contacts is arranged outside of a projection region defined by orthogonally projecting the internal contacts onto the bottom surface of the RDL.

2. The chip-scale sensor package structure according to claim 1, wherein an inner lateral side of the ring-shaped support is coplanar with an inner lateral side of the first package body.

3. The chip-scale sensor package structure according to claim 1, further comprising a second package body disposed on the top side of the first package body, wherein the second package body surrounds and is connected to the outer lateral side of the light permeable member.

4. The chip-scale sensor package structure according to claim 3, wherein the second package body surrounds and is connected to the outer lateral side of the ring-shaped support.

5. The chip-scale sensor package structure according to claim 3, wherein the first surface of the light permeable member is exposed from the second package body.

6. The chip-scale sensor package structure according to claim 3, wherein the top side of the first package body has an inner region connected to the ring-shaped body and an outer region that is connected to the second package body, and an area difference between the inner region and the outer region is equal to or less than 15% of an area of the top side of the first package body.

7. The chip-scale sensor package structure according to claim 3, wherein an outer lateral side of the first package body is coplanar with an outer lateral side of the second package body, and is coplanar with an outer lateral side of the RDL.

8. The chip-scale sensor package structure according to claim 1, wherein the RDL is formed directly on the bottom surface of the sensor chip and the bottom side of the first package body.

9. A chip-scale sensor package structure, comprising:

a sensor chip including a sensing region arranged on a top surface thereof, a plurality of internal contacts arranged on a bottom surface thereof, and a plurality of conductive paths extending from the top surface to the bottom surface thereof, wherein the conductive paths are respectively connected to the internal contacts and electrically coupled to the sensing region;

a first package body surrounding and connected to an outer lateral side of the sensor chip;

a ring-shaped support disposed on a top side of the first package body without contacting the top surface of the sensor chip, wherein the sensing region is spaced apart from the ring-shaped support by a distance which is less than 300 μm;

a light permeable member having a first surface and a second surface that is opposite to the first surface, wherein the second surface of the light permeable member is disposed on the ring-shaped support, and the light permeable member, the ring-shaped support, and the sensor chip jointly define an enclosed space;

a redistribution layer (RDL) disposed on the bottom surface of the sensor chip and a bottom side of the first package body, wherein a bottom surface of the RDL has a plurality of external contacts electrically coupled to the internal contacts; and a second package body disposed on the top side of the first package body, wherein the second package body surrounds and is connected to the outer lateral side of the light permeable member, and an outer lateral side of the first package body is coplanar with an outer lateral side of the second package body, and is coplanar with an outer lateral side of the RDL;

wherein the top side of the first package body is coplanar with the top surface of the sensor chip, and an outer lateral side of the light permeable member is coplanar with an outer lateral side of the ring-shaped support.

* * * * *